US010720312B2

(12) United States Patent
Nitadori et al.

(10) Patent No.: US 10,720,312 B2
(45) Date of Patent: Jul. 21, 2020

(54) SUBSTRATE PROCESSING APPARATUS (71) Applicant: TOKYO ELECTRON LIMITED, Tokyo (JP)

(72) Inventors: Hiromi Nitadori, Oshu (JP); Satoru Koike, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 427 days.

(21) Appl. No.: 15/469,612

(22) Filed: Mar. 27, 2017

(65) Prior Publication Data
US 2017/0287681 A1    Oct. 5, 2017

(30) Foreign Application Priority Data

Mar. 29, 2016    (JP) .................................. 2016-065250

(51) Int. Cl.
*C23C 16/455* (2006.01)
*H01J 37/32* (2006.01)
(Continued)

(52) U.S. Cl.
CPC .... *H01J 37/32449* (2013.01); *C23C 16/4412* (2013.01); *C23C 16/4583* (2013.01);
(Continued)

(58) Field of Classification Search
CPC .......... C23C 16/4412; C23C 16/45546; C23C 16/45578; C23C 16/45574; C23C 16/45591; C23C 16/4583; C23C 16/45563; C23C 16/452; C23C 16/45517; C23C 16/45548; H01L 21/67757; H01L 21/67303
See application file for complete search history.

(56) References Cited

U.S. PATENT DOCUMENTS

2014/0283750 A1\* 9/2014 Okada ................ C23C 16/4584
118/730

FOREIGN PATENT DOCUMENTS

JP         4-26115 A     1/1992
JP         6-302533 A    10/1994
(Continued)

*Primary Examiner* — Matthew J Song
(74) *Attorney, Agent, or Firm* — Nath, Goldberg & Meyer; Jerald L. Meyer (57) ABSTRACT A substrate processing apparatus includes: a substrate holder to vertically load a plurality of substrates in multiple stages with an interval therebetween and including a plurality of partition plates vertically partitioning a region where the plurality of substrates are loaded; a process chamber to receive the substrate holder therein; protrusions protruding inward toward the outer circumferential surfaces of the partition plates from an inner circumferential wall surface within the process chamber, which faces the outer circumferential surfaces of the partition plates, to form clearances between inner circumferential surfaces formed on the protruding tip ends of the protrusions and the outer circumferential surfaces of the partition plates; and a gas supply part to supply inert gas into the clearances, which are formed between the inner circumferential surfaces of the protrusions and the outer circumferential surfaces of the partition plates, to form positive-pressure sections subjected to a pressure higher than ambient pressure.

8 Claims, 5 Drawing Sheets

(51) Int. Cl.
*H01L 21/67* (2006.01)
*C23C 16/458* (2006.01)
*C23C 16/44* (2006.01)
*H01L 21/677* (2006.01)
*H01L 21/673* (2006.01)

(52) U.S. Cl.
CPC .. *C23C 16/45517* (2013.01); *C23C 16/45546* (2013.01); *C23C 16/45563* (2013.01); *C23C 16/45578* (2013.01); *C23C 16/45591* (2013.01); *H01J 37/321* (2013.01); *H01J 37/32458* (2013.01); *H01J 37/32623* (2013.01); *H01J 37/32779* (2013.01); *H01L 21/67109* (2013.01); *H01L 21/67303* (2013.01); *H01L 21/67757* (2013.01)

(56) References Cited

FOREIGN PATENT DOCUMENTS

| | | | | |
|---|---|---|---|---|
| JP | 11-233447 | A | 8/1999 | |
| JP | 2009-135551 | A | 6/2009 | |
| JP | 2009135551 | A * | 6/2009 | ............. H01L 21/31 |
| JP | 2014-207435 | A | 10/2014 | |

* cited by examiner

SUBSTRATE PROCESSING APPARATUS

CROSS-REFERENCE TO RELATED APPLICATION

This application claims the benefit of Japanese Patent Application No. 2016-065250, filed on Mar. 29, 2016, in the Japan Patent Office, the disclosure of which is incorporated herein in its entirety by reference.

TECHNICAL FIELD

The present disclosure relates to a substrate processing apparatus.

BACKGROUND

A semiconductor device manufacturing method is known in the related art, which includes: loading a plurality of substrates arranged in a direction perpendicular to substrate processing surfaces into a process chamber installed within a reaction tube whose outer periphery is surrounded by a heating device; and processing the substrates by introducing a gas into a gas introduction pipe, which is installed on a side surface of a substrate processing region inside the reaction tube to reach at least an outer side of the heating device, and then discharging the gas into the process chamber from discharging ports having a slit shape with a size corresponding to at least two or more substrates and arranged in the direction perpendicular to the substrate processing surfaces.

In the above-mentioned semiconductor device manufacturing method, a substrate processing process intends to enhance an in-plane uniformity and an inter-plane uniformity of the plurality of substrates by forming a side flow for each of multiple gas introduction partition parts and equalizing the amount of gas entering between the substrates by introducing the gas into the multiple gas introduction partition parts, which are installed in the gas introduction pipe and separated from one another by partition walls in the direction perpendicular to the substrate processing surfaces, and then discharging the gas into the process chamber from a discharging port installed in each of the multiple gas introduction partition parts.

However, even though the gas introduction partition parts are separated from one another by the partition walls in the above-described configuration of the semiconductor device manufacturing method, there are clearances which are not separated from one another between the partition walls and the substrates in the vertical direction, and the gas may move up and down through the clearances. Due to this, it may be difficult to form side flows having a uniform amount of gas in the gas introduction partition parts.

Further, particles are likely to be generated in upper and lower parts in the process chamber, and the particles can freely move up and down through the above-described clearances. Due to this, it is difficult to effectively restrict the particles from being spread over the substrates.

SUMMARY

Some embodiments of the present disclosure provide a substrate processing apparatus that can restrict the gas and the particles from moving between regions separated from one another in order to achieve excellent inter-plane and in-plane uniformity and can restrict particles from being spread over substrates.

According to an embodiment of the present disclosure, a substrate processing apparatus is provided. The processing apparatus includes: a substrate holder configured to vertically load a plurality of substrates in multiple stages with an interval therebetween and including a plurality of partition plates that vertically partition a region in which the plurality of substrates are loaded; a process chamber configured to receive the substrate holder therein; protrusions protruding inward toward outer circumferential surfaces of the partition plates from an inner circumferential wall surface within the process chamber, which faces the outer circumferential surfaces of the partition plates, to form clearances between inner circumferential surfaces formed on protruding tip ends of the protrusions and the outer circumferential surfaces of the partition plates; and a gas supply part configured to supply an inert gas into the clearances, which are formed between the inner circumferential surfaces of the protrusions and the outer circumferential surfaces of the partition plates, to form positive-pressure sections subjected to a pressure higher than an ambient pressure.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
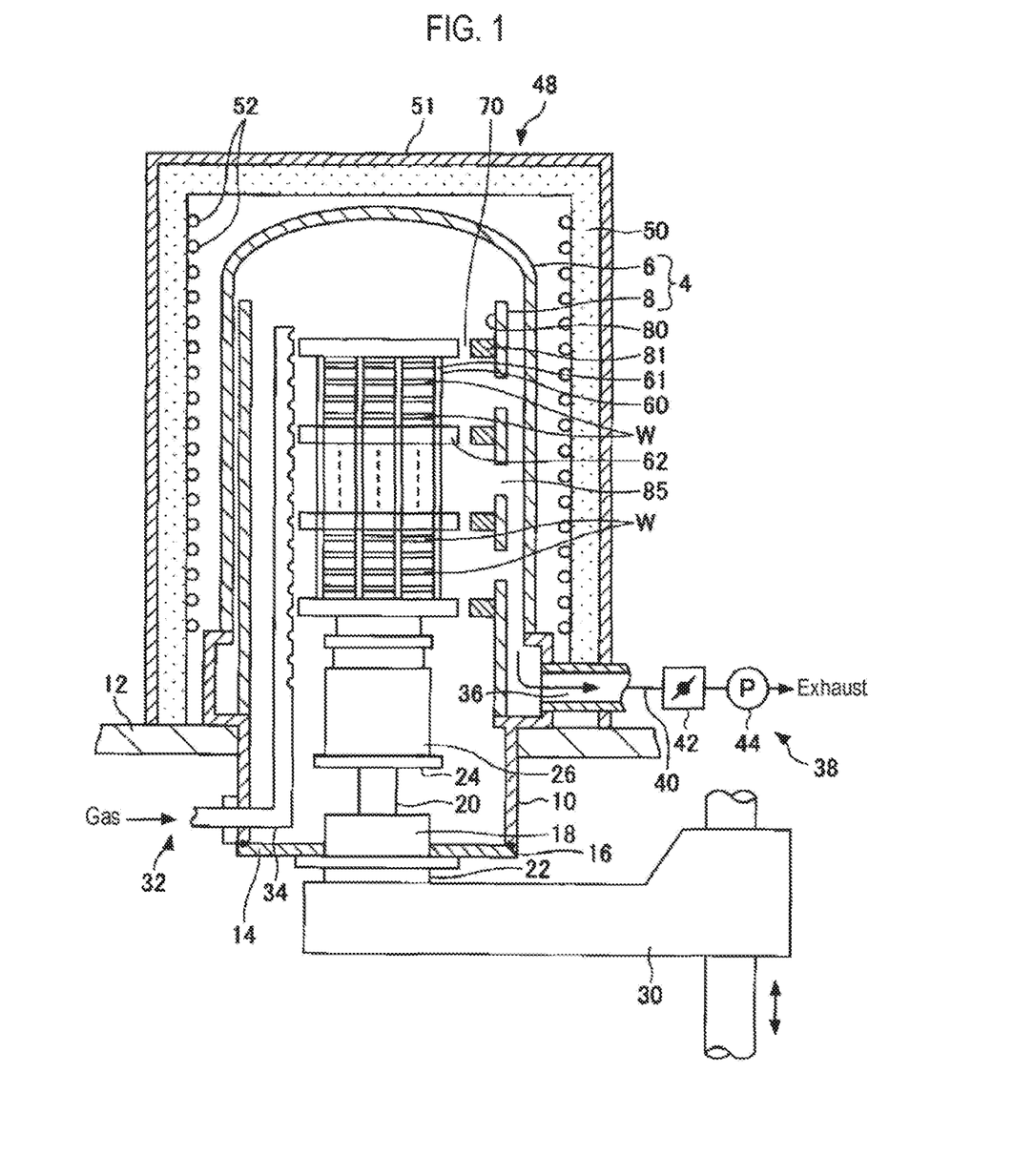
FIG. 1 is a view illustrating an overall configuration of one example of a substrate processing apparatus according to a first embodiment of the present disclosure.

FIG. 1 is a view illustrating an overall configuration of one example of a substrate processing apparatus according to a first embodiment of the present disclosure. Referring to FIG. 1, the substrate processing apparatus includes: a process chamber 4 having a plurality of substrates (hereinafter, referred to as the wafers W) received therein, which are vertically stacked one on another with a predetermined interval therebetween; and a heating device 48 that covers side and upper surfaces of the process chamber 4.

The process chamber 4 includes an outer tube 6 having a cylindrical shape with a cover and an inner tube 8 having a cylindrical shape with a cover and concentrically arranged inside the outer tube 6. The outer tube 6 and the inner tube 8 are formed of a material with heat resistance, for example, quartz. The outer tube 6 and the inner tube 8 are held at their lower ends by a manifold 10 being made of metal, for example, stainless steel, aluminum, etc. Further, the manifold 10 is secured to a base plate 12.

A cap part 14 having a disc shape, which is made of metal (for example, stainless steel, aluminum, etc.), is air-tightly installed in an opening at the lower end of the manifold 10 with a seal member 16 (such as an O-ring, etc.) interposed therebetween. Further, a rotation shaft 20, which is sealed to be rotatable, for example, by a magnetic fluid seal 18, is inserted through a central portion of the cap part 14. The lower end of the rotation shaft 20 is connected to a rotation mechanism 22. The upper end of the rotation shaft 20 is secured to a table 24 made of, for example, metal.

A heat-insulating tube 26 made of quartz, for example, is installed on the table 24. A wafer boat 60 made of quartz, for example, is loaded on the heat-insulating tube 26 as a substrate holder. The wafer boat 60 has, for example, 50 to 150 wafers W vertically loaded therein at a predetermined interval, for example, with a pitch of, for example, about 10 mm. The wafer boat 60 includes, for example, three or four pillars 61. The wafers W are loaded on bottom surfaces of recesses (not illustrated) horizontally formed on inner surfaces of the pillars 61. The wafer boat 60, the heat-insulating tube 26, the table 24, and the cap part 14 are integrally loaded into, and unloaded out of, the process chamber 4 by a lifting mechanism 30, for example, a boat elevator.

The wafer boat 60 includes a plurality of partition plates 62 for separating the loaded wafers W in the vertical direction. The partition plates 62 form a plurality of regions in the wafer boat 60, which are separated from one another in the vertical direction. The partition plates 62 are installed to form side flows of a process gas in each of the separated regions in order to perform uniform substrate processing on the wafers W. The partition plates 62 are formed of planar members that are thicker than the wafers W. Since the wafers W basically have a disc shape and the inner tube 8 also has a cylindrical shape, the partition plates are also formed of circular plate members having a disc shape.

Since the partition plates 62 function as partition walls in the vertical direction, the partition plates 62 have outer circumferential ends further protruding outward beyond the wafers W, and the pillars 61 supporting the wafers W and are horizontally installed parallel to the wafers W. The partition plates 62, which have a greater diameter than the pillars 61 and have a greater thickness than the wafers W, are installed in multiple positions in the wafer boat 60 to divide the plurality of loaded wafers W into multiple groups in the vertical direction.

The partition plates 62 are preferably installed on at least upper and lower ends of the wafer boat 60, as illustrated in FIG. 1. Although a detailed description will be given below, particles are likely to be generated inside the lower part of the inner tube 8 since a gas swirls upward when a pressure within the process chamber returns to an atmospheric pressure and particles fall from above. Accordingly, in order to prevent an infiltration of the particles, the partition plates 62 are preferably installed above the uppermost wafer W and below the lowermost wafer W to surround at least the uppermost and lowermost loaded wafers W.

Protrusions 81 protruding inwardly toward outer circumferential surfaces of the partition plates 62 are formed in the positions on an inner circumferential wall surface 80 of the inner tube 8 that face the partition plates 62. The protrusions 81 have substantially the same thickness as those of the partition plates 62 and have a shape protruding toward the outer circumferential surfaces of the partition plates 62. Accordingly, the outer circumferential surfaces of the partition plates 62 face the inner circumferential surfaces of the protrusions 81, and narrow clearances 70 are formed therebetween. Although a detailed description will be given below, an inert gas is supplied into the clearances 70 to form positive-pressure sections therein, which are subjected to a positive pressure higher than that of an ambient atmosphere. Accordingly, the regions formed by the partition plates 62 and the protrusions 81 are separated from one another so that it is possible to form side flows in the regions. Further, when the partition plates 62 have a disc shape, the inner circumferential surfaces of the protrusions 81 also have a circular shape so that the positive-pressure sections have an annular shape.

Exhaust holes 85 are provided between the protrusions 81 on the inner circumferential wall surface 80 of the inner tube 8. Accordingly, the supply and separate exhaust of the process gas in the regions separated from one another by the partition plates 62 are possible, and thus it is easy to form side flows.

A detailed description of the configuration associated with the partition plates 62 will be given below, and other elements will be hereinafter described.

A gas nozzle 34 is coupled to the lower portion of the manifold 10. The gas nozzle 34 has one end portion air-tightly passing through the manifold 10 and is bent upward along the inner circumferential surface of the inner tube 8. The gas nozzle 34 is connected, at an opposite end thereof, to a gas supply source (not shown) through a predetermined pipe. Further, for example, a flow-rate control device (such as a mass flow controller, etc.) and opening/closing valves (not illustrated) are installed on the pipe to control a supply start, a supply stop, a flow rate and the like of a gas supplied from the gas nozzle 34 into the process chamber 4. While one gas nozzle 34 is illustrated in FIG. 1, a plurality of gas nozzles 34 may be provided according to the types of used gases. For example, a gas nozzle 34 for a silicon-containing gas, a gas nozzle 34 for an oxidizing gas, and a gas nozzle 34 for a purge gas may be provided in a case where silicon oxide films are formed on the wafers W by the substrate processing apparatus.

A gas exhaust port 36 is formed through an upper portion of the manifold 10, and an exhaust system 38 is connected to the gas exhaust port 36. The exhaust system 38 includes an exhaust passage 40 connected to the gas exhaust port 36 and a pressure regulation valve 42 and a vacuum pump 44 that are sequentially connected in the middle of the exhaust passage 40. The exhaust system 38 exhausts the gas supplied into the process chamber 4 and regulates the pressure within the process chamber 4.

The manifold 10 may not be provided and the entire process chamber 4 may be made of quartz, for example.

The heating device 48 includes a heat-insulating body 50 having a cylindrical shape with a cover. The heat-insulating body 50 is formed of, for example, a mixture of amorphous silica and alumina which have a low thermal conductivity. The heat-insulating body 50 usually has a thickness of about 30 mm to about 40 mm. The heat-insulating body 50 has an inner diameter greater than an outer diameter of the process chamber 4 by a predetermined length so that a predetermined space is formed between the inner surface of the heat-insulating body 50 and the outer surface of the process chamber 4. A protective cover 51 made of, for example, stainless steel is provided on the outer circumferential surface of the heat-insulating body 50 to cover the entirety of the heat-insulating body 50.

A heater wire 52 is wound in a coil shape on the inner surface of the heat-insulating body 50 to form a heater having a cylindrical shape as a whole and surrounding the process chamber 4.

Next, the configuration associated with the partition plates 62 and the protrusions 81 will be described in more detail.

Figure 2:
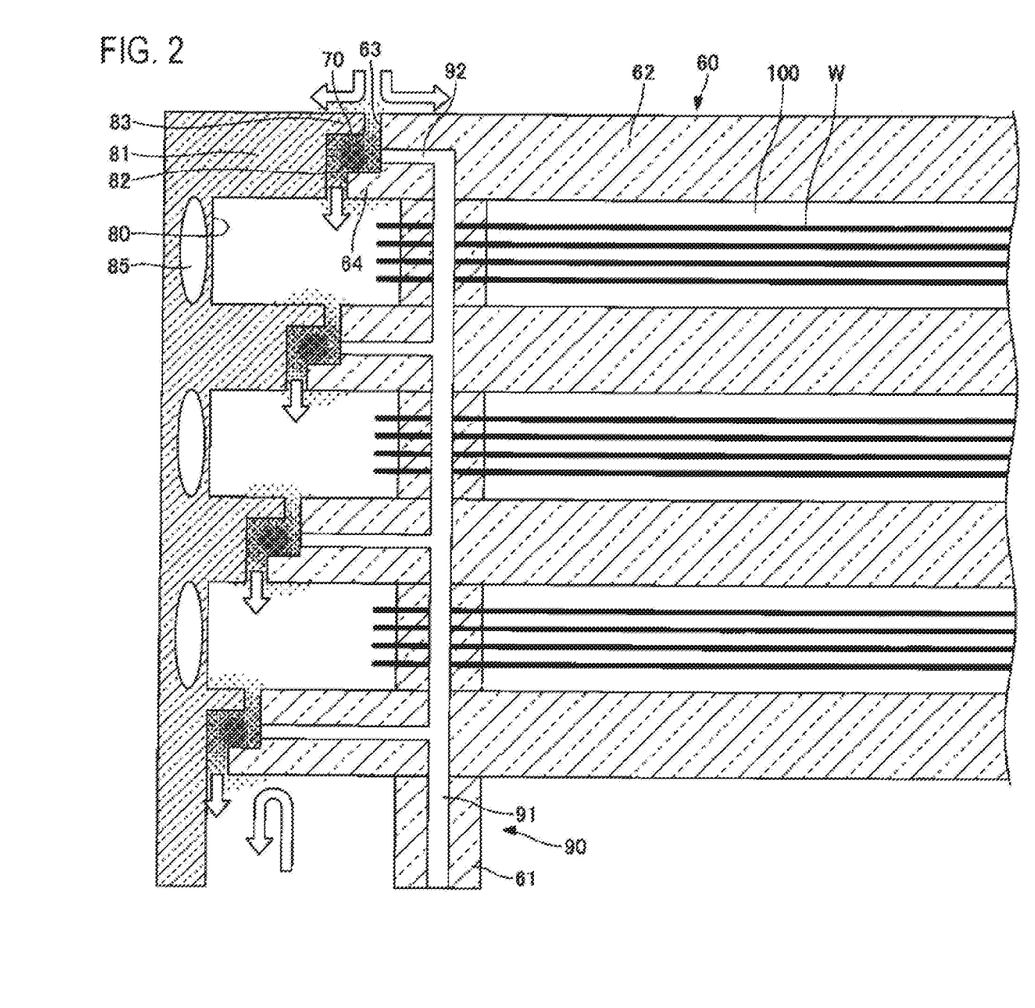
FIG. 2 is an enlarged sectional view illustrating a configuration in the vicinity of facing surfaces of a wafer boat and an inner tube of the substrate processing apparatus according to the first embodiment of the present disclosure.

FIG. 2 is an enlarged sectional view illustrating the configuration in the vicinity of the facing surfaces of the wafer boat and the inner tube of the substrate processing apparatus according to the first embodiment of the present disclosure. In FIG. 2, a positional relationship between the partition plates 62 of the wafer boat 60 and the protrusions 81 of the inner tube 8 is shown opposite to the positional relationship shown in FIG. 1 in the left-to-right direction. However, the configuration shown in FIG. 2 is not contradictory to that in FIG. 1, since the configuration shown in FIG. 2 is obtained when viewed from a back side of FIG. 1.

As illustrated in FIG. 2, one partition plate 62 is installed above the upper end of the region of the wafer boat 60 in which the wafers W are loaded, another partition plate 62 is installed below the lower end of the region, and two more partition plates 62 are installed therebetween. As a result, the region is divided into three regions 100 in the vertical direction. Since a plurality of, for example, 50 to 100, wafers W are loaded in the wafer boat 60, the wafers W are divided into multiple groups, and the wafer groups are retained in the respective regions 100 separated from one another by the partition plates 62.

Since each partition plate 62 has a larger diameter than the wafers W and the pillars 61, the partition plate 62 further protrudes outward beyond the wafers W and the pillars 61 so that the outer circumferential surface 63 of the partition plate 62 is located outside the wafers W and the pillars 61. The partition plate 62 has a thickness much greater than the total thickness of several wafers W stacked together.

The protrusions 81 protruding inwardly toward the outer circumferential surfaces 63 of the partition plates 62 are formed in the regions on the inner circumferential wall surface 80 of the inner tube 8 that face the partition plates 62 of the wafer boat 60. The protrusions 81 extend to the vicinity of the outer circumferential surfaces 63 of the partition plates 62 so that the clearances 70 are formed between the inner circumferential surfaces 82 of the protrusions 81 and the outer circumferential surfaces 63 of the partition plates 62.

Gas supply conduits 90 are installed within the pillars 61 and the partition plates 62 of the wafer boat 60. The gas supply conduits 90 are gas supply part for supplying an inert gas to the clearances 70. Each gas supply conduit 90 includes a joint conduit 91 installed to pass through an inside of the corresponding pillar 61, and branch conduits 92 are installed to pass through insides of the respective partition plates 62. The inert gas supplied through the joint conduit 91 is supplied into the clearances 70, which are formed between the outer circumferential surfaces 63 of the partition plates 62 and the inner circumferential surfaces 82 of the protrusions 81, through the branch conduits 92. Accordingly, the clearances 70 are subjected to a positive pressure higher than that of the ambient atmosphere so that it is possible to prevent a movement of the process gas between the regions 100 separated from one another by the partition plates 62.

As illustrated in FIG. 2, a projecting structure 83 further protrudes inward from each protrusion 81 of the inner tube 8 along the upper surface of the protrusion 81, and a projecting structure 64 further protrudes outward from each partition plate 62 along a lower surface of the partition plate. The projecting structures 64 and 83 are labyrinth structures surrounding the corresponding clearance 70. In other words, the projecting structures 64 and 83 constitute a labyrinth seal in cooperation with each other. Accordingly, it is possible to surely seal the plurality of regions 100 separated from one another by the partition plates 62.

It is not essential to install the labyrinth structures. If it is sufficient to supply only the inert gas to the clearances 70, the projecting structures 64 and 83 do not necessarily have to be installed, and the inner circumferential surfaces 82 of the protrusions 81 and the outer circumferential surfaces 63 of the partition plates 62 may be formed as flat surfaces.

In contrast, the number of projecting structures 64 and 83 may be increased in order to further enhance seal efficiency.

Various gases that do not react with the process gas may be used as the inert gas supplied to the clearances 70 through the gas supply conduits 90, but, for example, a nitrogen gas or an argon gas may be used.

The exhaust holes 85 may be formed through the inner circumferential wall surface 80 of the inner tube 8 corresponding to the respective regions 100 in some embodiments. In other words, in some embodiments, the exhaust holes 85 may be formed through the inner circumferential wall surface 80 between the protrusions 81. Accordingly, when the process gas is supplied to the regions 100 separated from one another by the partition plates 62, the exhaust of the process gas may be carried out for each region 100 so that it is easy to form a side flow in each of the regions 100. The side flow enables a laminar flow to be formed in each region 100 in one direction (a horizontal direction) and enables a uniform flow having no significant difference to be formed in the central regions and the outer circumferential regions of the wafers W. If the process gas can be supplied as described above, it is possible to enhance both the inter-wafer (vertical) uniformity and the in-plane (horizontal) uniformity in the substrate processing of the wafers W.

While the number of partition plates 62 may be appropriately determined according to the purpose, it is preferable that one partition plate 62 is installed above the uppermost wafer W and one partition plate 62 be installed below the lowermost wafer W. Since a large amount of particles swirl upward when the process chamber returns to the atmospheric pressure state from the vacuum state in the lower part of the inner tube 8 and a large amount of particles fall from the ceiling to the upper part of the inner tube 8, there may be provided a configuration that prevents an infiltration of the particles at upper and lower ends of the inner tube in some embodiments.

Further, even though the particles infiltrate into the regions 100, a movement of the particles between the upper and lower regions are restricted since the clearances 70 are subjected to a positive pressure to constitute annular positive-pressure sections.

As described above, according to the substrate processing apparatus according to the first embodiment of the present disclosure, both the process gas and the particles are restricted from moving between the regions 100 separated from one another by the partition plates 62 so that it is possible to completely isolate the regions 100 from one another, thereby carrying out substrate processing with high inter-plane and in-plane uniformity.

In FIG. 2, the partition plates 62 have gradually increasing diameters from the upper end to the lower end of the wafer boat, and the lengths of the protrusions 81 gradually decrease from the upper end to the lower end of the wafer boat, accordingly. This aims to prevent the projecting structures 64 from making contact with the projecting structures 83 therebelow when the wafer boat 60 is carried out of the inner tube. In other words, if the configuration of FIG. 2 is made with the partition plates 62 having the same diameter, the projecting structures 64 of the partition plates 62 are stopped by the projecting structures 83 of the protrusions 81 therebelow when the wafer boat 60 is carried out of the inner tube so that it is impossible to extract the wafer boat 60.

Accordingly, the partition plates 62 have gradually increasing diameters.

Second Embodiment

Figure 3:
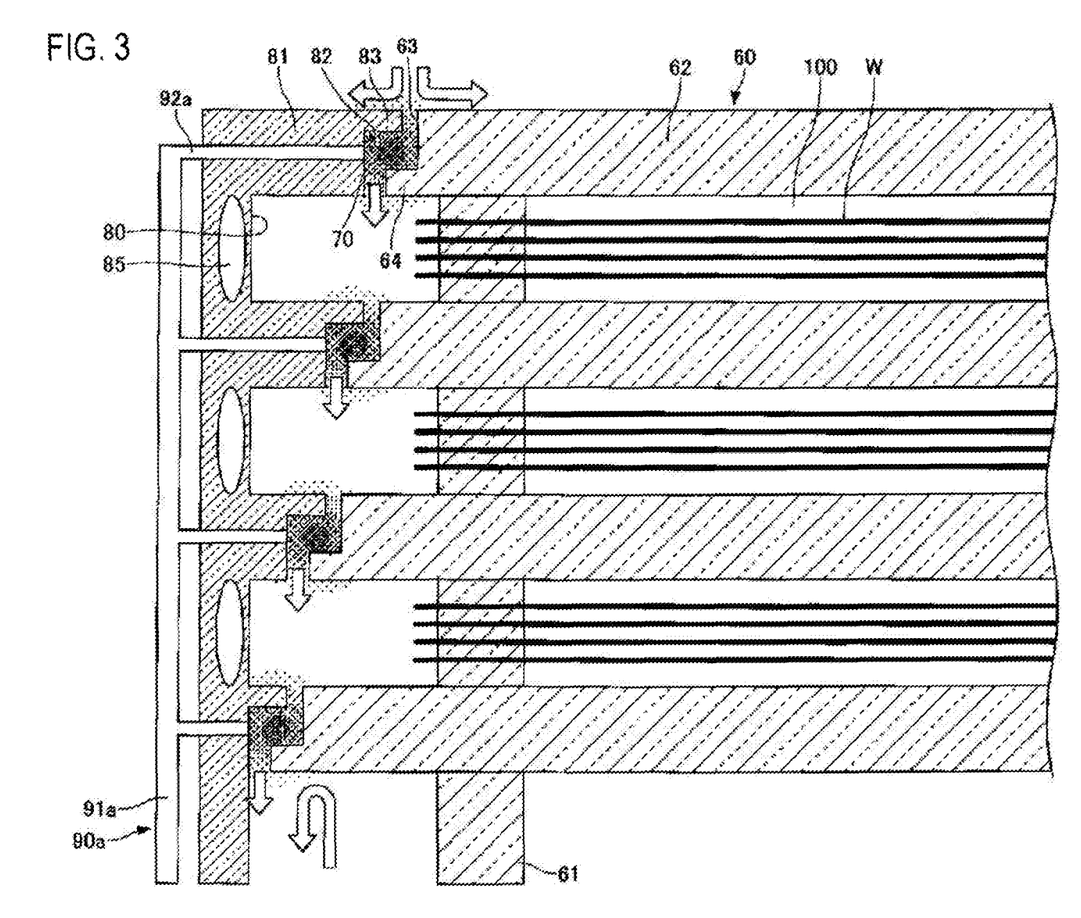
FIG. 3 is a sectional view illustrating one example of a substrate processing apparatus according to a second embodiment of the present disclosure.

FIG. 3 is a sectional view illustrating one example of a substrate processing apparatus according to a second embodiment of the present disclosure. As illustrated in FIG. 3, in the substrate processing apparatus according to the second embodiment of the present disclosure, a gas supply conduit 90a is not installed in a wafer boat 60, but in an inner tube 8. The gas supply conduit 90a may be installed in the inner tube 8 rather than in the wafer boat 60, as described above.

As illustrated in FIG. 3, branch conduits 92a are installed through protrusions 81. Meanwhile, a joint conduit 91a is installed outside the inner tube 8. As described above, the joint conduit 91a may be installed outside the inner tube 8, and only the branch conduits 92a may be installed to pass through insides of the protrusions 81. Alternatively, the joint conduit 91a may also be installed to pass through an inside of the inner tube 8, if it is better to do so.

As described above, the gas supply conduits 90 and 90a may be installed in various positions as long as an inert gas can be supplied into the clearances 70. While the gas supply conduits 90 and 90a have been described as being installed in the wafer boat 60 and the inner tube 8 in the first and second embodiments, the present disclosure is not limited thereto, and dedicated gas supply conduits 90 and 90a may be installed in various positions to supply an inert gas into the clearances 70 so that the clearances 70 can be subjected to a positive pressure.

Since other elements in the second embodiment are identical to those in the first embodiment, corresponding elements are provided with identical reference numerals, and descriptions thereof will be omitted.

According to the substrate processing apparatus of the second embodiment, the gas supply conduit 90a can be fixedly installed in the stationary inner tube 8, which makes it possible to stably supply gas.

Third Embodiment

Figure 4:
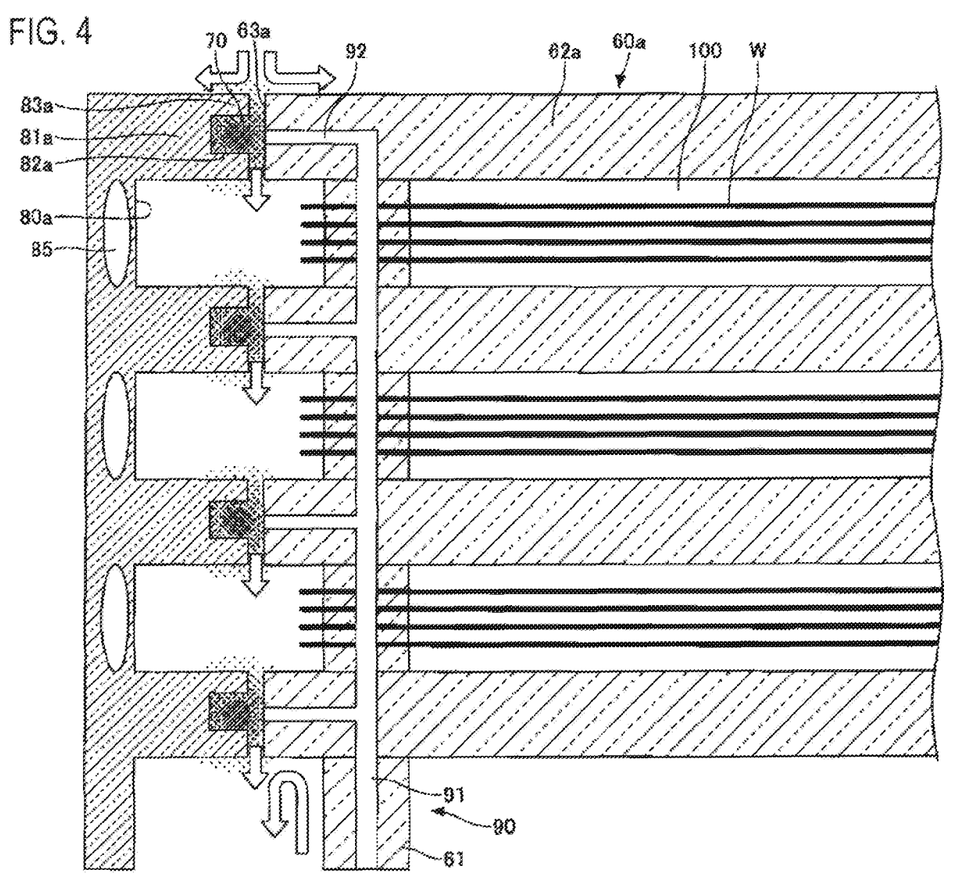
FIG. 4 is a sectional view illustrating one example of a substrate processing apparatus according to a third embodiment of the present disclosure.

FIG. 4 is a sectional view illustrating one example of a substrate processing apparatus according to a third embodiment of the present disclosure. As illustrated in FIG. 4, the substrate processing apparatus according to the third embodiment of the present disclosure differs from the substrate processing apparatus according to the first embodiment in that both upper and lower projecting structures 83a constituting a labyrinth structure protrude from the inner circumferential surface 82a of each protrusion 81a of an inner tube 8, and the outer circumferential surface 63a of each partition plate 62a is configured to be a flat surface.

As described above, the labyrinth structure may only be installed on the protrusion 81a of the inner tube 8. Even in this case, narrow sections are formed between the upper and lower projecting structures 83a and the partition plate 62a, which face each other, to constitute a labyrinth seal, thereby ensuring air tightness between upper and lower regions 100.

By adopting this configuration, it is possible to equalize all the diameters of the multiple partition plates 62a of the wafer boat 60a and to configure the outer circumferential surfaces 63a thereof to be flat surfaces, thereby simplifying the structure of the wafer boat 60a.

Further, the wafer boat 60a can be further simplified by installing a gas supply conduit 90 on the side of the inner tube 8 as in the second embodiment.

As described above, according to the substrate processing apparatus of the third embodiment, it is possible to simplify the configuration of the wafer boat 60a and to enhance the inter-plane and in-plane uniformity of substrate processing.

Since other elements in the third embodiment are identical to those of the substrate processing apparatus according to the first embodiment, corresponding elements are provided with identical reference numerals, and descriptions thereof will be omitted.

Fourth Embodiment

Figure 5:
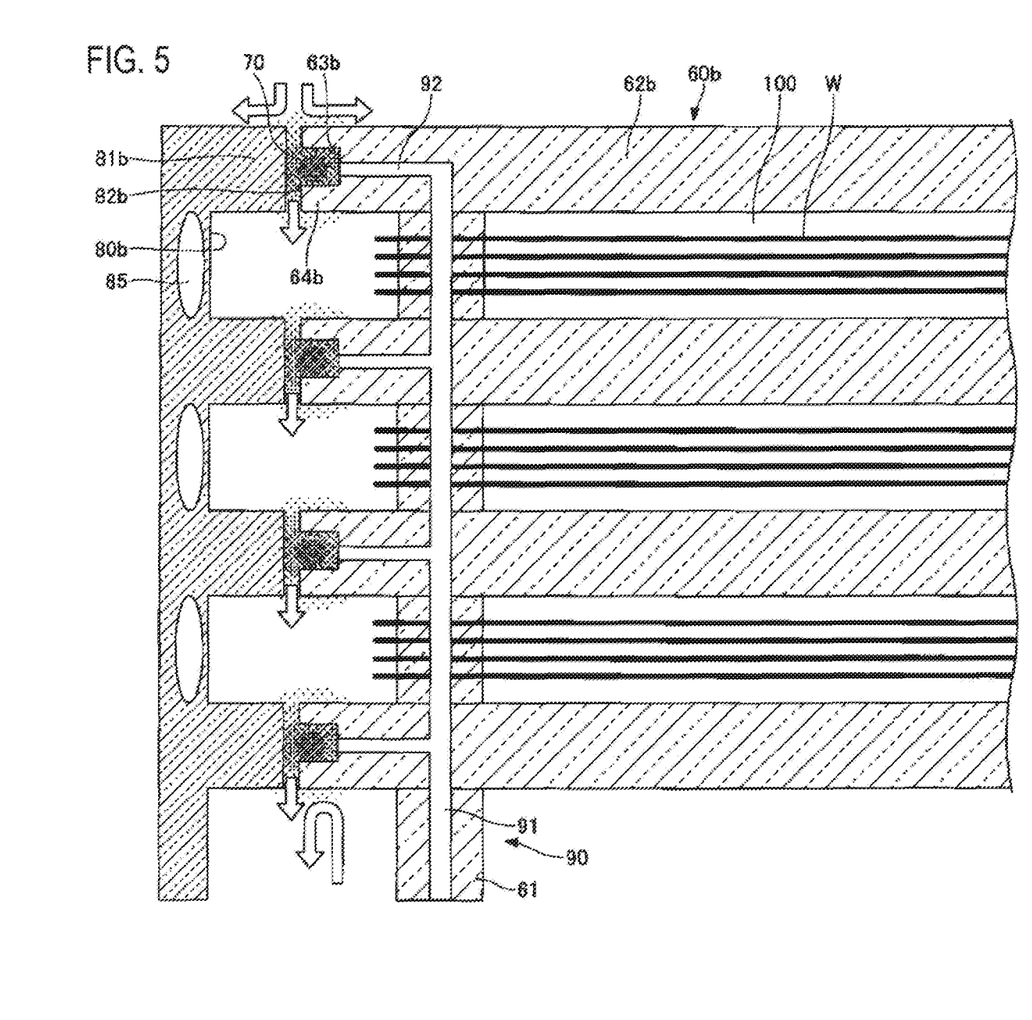
FIG. 5 is a sectional view illustrating one example of a substrate processing apparatus according to a fourth embodiment of the present disclosure.

FIG. 5 is a sectional view illustrating one example of a substrate processing apparatus according to a fourth embodiment of the present disclosure. As illustrated in FIG. 5, the substrate processing apparatus according to the fourth embodiment of the present disclosure differs from the substrate processing apparatus according to the first embodiment in that both upper and lower projecting structures 64b constituting a labyrinth structure protrude from an outer circumferential surface 63b of each partition plate 62b of a wafer boat 60b, and an inner circumferential surface 82b of each protrusion 81b of an inner tube 8 is configured to be a flat surface.

As described above, the labyrinth structure may only be installed on the partition plate 62b of the wafer boat 60b. Even in this case, narrow sections are formed between the upper and lower projecting structures 64b and the protrusion 81b, which face each other, to constitute a labyrinth seal, thereby ensuring air tightness between upper and lower regions 100.

By adopting this configuration, it is possible to equalize all the lengths of the multiple protrusions 81b of the inner tube 8 and to configure the inner circumferential surfaces 82b thereof to be flat surfaces, thereby simplifying a structure of an inner circumferential wall surface 80b of the inner tube 8.

Although the structure of the outer circumferential surfaces 63b of the partition plates 62b is complicated, the diameters of the partition plates 62b can all be equalized so that it is possible to easily handle the wafer boat 60b.

Furthermore, the wafer boat 60b can be further simplified by installing a gas supply conduit 90 on the side of the inner tube 8 as in the second embodiment.

As described above, according to the substrate processing apparatus of the fourth embodiment, it is possible to simplify the configuration of the protrusions 81b of the inner tube 8 and to enhance the inter-plane and in-plane uniformity of substrate processing.

Since other elements in the fourth embodiment are identical to those of the substrate processing apparatus according to the first embodiment, corresponding elements are provided with identical reference numerals, and descriptions thereof will be omitted.

As described above, according to the substrate processing apparatuses of the first to fourth embodiments, by installing the annular positive-pressure sections, it is possible to enhance the air tightness between the regions 100 separated from one another by the partition plates 62, 62a, and 62b and to restrict the process gas and particles from moving between the regions 100, thereby enhancing the inter-plane and in-plane uniformity of substrate processing.

In regard to the labyrinth structures, although not disclosed in the first to fourth embodiments, projecting structures may be provided on both the outer circumferential surface 63 of each partition plate 62 and the inner circumferential surface 82 of each protrusion 81 to face each other.

While the wafers W have a circular shape and the inner tubes 8 have a cylindrical shape in the first to fourth embodiments, a structure in which polygonal substrates are processed and outer surfaces of the substrates face inner circumferential surfaces of protrusions on an inner circumferential surface of a process chamber with a constant clearance therebetween may also be applied to the substrate processing apparatuses.

According to the present disclosure, it is possible to perform uniform substrate processing on a plurality of substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a substrate holder configured to vertically load a plurality of substrates in multiple stages with an interval therebetween and including a plurality of partition plates that vertically partition a region in which the plurality of substrates are loaded;
   a process chamber configured to receive the substrate holder therein;
   protrusions protruding inward toward outer circumferential surfaces of the partition plates from an inner circumferential wall surface within the process chamber, which faces the outer circumferential surfaces of the partition plates, to form clearances between inner circumferential surfaces formed on protruding tip ends of the protrusions and the outer circumferential surfaces of the partition plates; and
   a gas supply part including at least one of a first conduit installed within the protrusions and a second conduit installed within the partition late and configured to supply an inert gas into the clearances from at least one of first supply ports formed in the inner circumferential surfaces of the protrusions and second supply ports formed in the outer circumferential surfaces of the partition plates, the clearances being formed between the inner circumferential surfaces of the protrusions and the outer circumferential surfaces of the partition plates, to form positive-pressure sections subjected to a pressure higher than an ambient pressure,
   wherein the first supply orts are communicated with the first conduit, and
   wherein the second supply ports are communicated with the second conduit.

2. The apparatus of claim 1, wherein the partition plates have a circular disc shape, and the positive-pressure sections have an annular shape.

3. The apparatus of claim 1, wherein the gas supply part is installed to pass through an inside of at least one of the partition plates and the protrusions.

4. The apparatus of claim 1, wherein a labyrinth structure is installed on at least one of the inner circumferential surfaces of the protrusions and the outer circumferential surfaces of the partition plates.

5. The apparatus of claim 4, wherein the labyrinth structure includes a plurality of projecting structures protruding toward surfaces facing the projecting structures, and
   the plurality of projecting structures include a projecting structure installed along an upper surface of at least one of the inner circumferential surface of the protrusion and the outer circumferential surface of the partition plate and a projecting structure installed along a lower surface of at least one of the inner circumferential surface of the protrusion and the outer circumferential surface of the partition plate.

6. The apparatus of claim 1, wherein the plurality of partition plates and the plurality of protrusions include a partition plate and a protrusion that are formed to surround an upper end of the region in which the substrates are loaded and a partition plate and a protrusion that are formed to surround a lower end of the region.

7. The apparatus of claim 1, further comprising:
   a process gas supply part configured to horizontally discharge a process gas along a vertical direction within the process chamber,
   wherein an exhaust port is formed in a region between the protrusions located on the inner circumferential wall surface within the process chamber, and
   wherein a side flow is formed in a region between the partition plates.

8. The apparatus of claim 1, further comprising:
   a heater configured to heat the plurality of substrates installed around the process chamber,
   wherein the process chamber is a reaction tube extending in a vertical direction, and
   wherein the inner circumferential wall surface within the process chamber is an inner circumferential wall surface of an inner tube installed in the reaction tube.

* * * * *

UNITED STATES PATENT AND TRADEMARK OFFICE
CERTIFICATE OF CORRECTION

PATENT NO. : 10,720,312 B2
APPLICATION NO. : 15/469612
DATED : July 21, 2020
INVENTOR(S) : Hiromi Nitadori and Satoru Koike Page 1 of 1

It is certified that error appears in the above-identified patent and that said Letters Patent is hereby corrected as shown below:

In the Claims

Claim 1, Column 9, Line 58, please delete the word "late" and replace with "plates".

Signed and Sealed this
Eighth Day of September, 2020

Andrei Iancu
*Director of the United States Patent and Trademark Office*